(12) United States Patent
Schrattenecker et al.

(10) Patent No.: US 10,564,202 B2
(45) Date of Patent: Feb. 18, 2020

(54) DEVICE, SYSTEM AND METHOD FOR AUTOMATIC TEST OF INTEGRATED ANTENNAS

(71) Applicant: Infineon Technologies AG, Neubiberg (DE)

(72) Inventors: Jochen O. Schrattenecker, Reichenthal (AT); Oliver Frank, Linz (AT); Alexander Kaineder, Linz (AT)

(73) Assignee: Infineon Technologies AG, Neubiberg (DE)

( * ) Notice: Subject to any disclaimer, the term of this patent is extended or adjusted under 35 U.S.C. 154(b) by 291 days.

(21) Appl. No.: 15/634,588

(22) Filed: Jun. 27, 2017

(65) Prior Publication Data

US 2018/0003754 A1    Jan. 4, 2018

(30) Foreign Application Priority Data

Jun. 29, 2016   (DE) .................. 10 2016 111 884

(51) Int. Cl.
| | |
|---|---|
| *G01R 29/10* | (2006.01) |
| *G01R 31/302* | (2006.01) |
| *G01S 7/40* | (2006.01) |
| *G01R 1/04* | (2006.01) |
| *H01Q 1/32* | (2006.01) |

(52) U.S. Cl.
CPC .......... *G01R 29/10* (2013.01); *G01R 31/302* (2013.01); *G01S 7/4004* (2013.01); *G01R 1/045* (2013.01); *H01Q 1/3233* (2013.01)

(58) Field of Classification Search
CPC .. G01R 29/10; G01R 31/2822; G01R 31/302; G01R 1/045; G01S 7/40; G01S 7/4004; H01Q 1/2283; H01Q 1/3233

USPC .......................................................... 342/173
See application file for complete search history.

(56) References Cited

U.S. PATENT DOCUMENTS

| | | | | |
|---|---|---|---|---|
| 4,767,983 A | * | 8/1988 | Pfaff .................... | G01R 1/0433 324/754.08 |
| 4,978,912 A | * | 12/1990 | Vonder ................. | G01R 1/0425 324/72.5 |
| 5,049,813 A | * | 9/1991 | Van Loan ............ | G01R 1/0425 324/754.14 |
| 5,180,976 A | * | 1/1993 | Van Loan ............ | G01R 1/0425 324/754.09 |

(Continued)

FOREIGN PATENT DOCUMENTS

EP           0305951 A1 *  3/1989  ........... G01R 1/0425

OTHER PUBLICATIONS

German Patent Office, Office Action issued for DE 102016111884. 2, 7 pgs., dated Mar. 12, 2017.

(Continued)

*Primary Examiner* — Timothy A Brainard
*Assistant Examiner* — Nuzhat Pervin
(74) *Attorney, Agent, or Firm* — Schiff Hardin LLP

(57) ABSTRACT

A test set-up for testing a system-in package with an integrated antenna is described herein. According to one exemplary embodiment, the test set-up includes a carrier with an RF probe arranged thereon and a test socket with resilient electric contacts. The test socket is mounted on the carrier and provides an electric contact to interconnects of the package when it is placed on the test socket. The test socket has an opening which is arranged superjacent to the RF probe.

19 Claims, 3 Drawing Sheets

(56) References Cited

U.S. PATENT DOCUMENTS

| | | | | |
|---|---|---|---|---|
| 5,247,246 A * | 9/1993 | Van Loan | ............ | G01R 31/316 324/754.14 |
| 5,289,117 A * | 2/1994 | Van Loan | ............ | G01R 31/316 324/754.08 |
| 5,444,387 A * | 8/1995 | Van Loan | ............ | G01R 1/0425 324/750.25 |
| 5,838,159 A * | 11/1998 | Johnson | ............ | G01R 1/0483 324/754.08 |
| 6,229,319 B1 * | 5/2001 | Johnson | ............ | G01R 1/0483 324/754.09 |
| 7,247,035 B2 * | 7/2007 | Mok | ............ | C23C 18/00 439/66 |
| 7,349,223 B2 * | 3/2008 | Haemer | ............ | G01R 1/07314 29/593 |
| 7,501,839 B2 * | 3/2009 | Chan | ............ | G01R 1/06711 324/754.18 |
| 7,656,524 B2 * | 2/2010 | Sokolov | ............ | G01N 21/658 356/301 |
| 8,212,580 B2 * | 7/2012 | Izadian | ............ | G01R 1/045 324/755.02 |
| 8,373,429 B2 * | 2/2013 | Slupsky | ............ | G01R 1/07 324/754.31 |
| 8,829,934 B2 * | 9/2014 | Sellathamby | ............ | G01R 31/3025 324/754.03 |
| 9,331,751 B2 * | 5/2016 | Sikina | ............ | H04B 5/0043 |
| 2004/0051541 A1 * | 3/2004 | Zhou | ............ | G01R 1/07378 324/756.03 |
| 2007/0075726 A1 * | 4/2007 | Chan | ............ | G01R 1/06711 324/754.18 |
| 2009/0066356 A1 * | 3/2009 | Slupsky | ............ | G01R 1/07 324/754.31 |
| 2009/0072843 A1 * | 3/2009 | Slupsky | ............ | G01R 31/2889 324/750.01 |
| 2009/0153158 A1 * | 6/2009 | Dunn | ............ | G01R 31/2822 324/762.01 |
| 2011/0006794 A1 * | 1/2011 | Sellathamby | ............ | G01R 31/3025 324/754.03 |
| 2013/0207681 A1 * | 8/2013 | Slupsky | ............ | G01R 1/07 324/754.21 |
| 2015/0168486 A1 * | 6/2015 | Isaac | ............ | G01R 1/045 324/756.02 |

OTHER PUBLICATIONS

Farouq, M., et al., "Antenna Characterization From Arbitrary Near Field Measurement Geometry", IEEE Conference on Antenna Measurements & Application (CAMA), 4 pgs., 2014.

* cited by examiner

DEVICE, SYSTEM AND METHOD FOR AUTOMATIC TEST OF INTEGRATED ANTENNAS

TECHNICAL FIELD

The present disclosure relates to a device, a system and a method for automatic testing integrated antenna as used, e.g. in radar sensors.

BACKGROUND

Antennas, which are integrated in a chip package e.g. together with a radio frequency (RF) frontend, are common used in radar applications such as radar distance and velocity sensors. Particularly in the automotive sector, there is an increasing demand for radar sensors used in so-called "adaptive cruise control" (ACC) or "radar cruise control" systems. Such systems may be used, for example, to automatically adjust the speed of an automobile so as to maintain a safe distance from other automobiles or other objects ahead.

Modern radar systems make use of highly integrated RF circuits, which may incorporate all core functions of the RF frontend of a radar transceiver in one single package (single chip transceiver). Such RF frontends may include, inter alia, a voltage controlled oscillator (VCO), amplifiers such as power amplifiers and low noise amplifiers (LNAs), and mixers to down-convert the RF signals into a base band or an intermediate frequency (IF) band. Furthermore, the single chip transceiver may include one or more antennas, which is thus referred to as antenna-in-package (AiP). Besides the antennas and the RF frontend also the analog base-band signal processing chain may be included in the same chip package. Therefore, these highly integrated RF transceivers as used, for example, in radar sensors, are referred to as system-in-package (SiP).

Radar applications used in automobiles are subject to various standards concerning road traffic safety, for example the functional safety standard ISO 26262 titled "Road vehicles—Functional safety". To ensure a proper function of a radar sensor, the RF transceiver chip may be subjected to various tests at the end of the production process (end-of-line test, EOL test). The electromagnetic performance of the RF transceiver and the antennas is of particular interest. However, it seems as if no satisfying approaches for testing systems-in-package (SiP) including a monolithic microwave integrated circuit (MMIC) as well as an antenna-in-package (AiP) exists. According to known approaches, the SiP is soldered to a printed circuit board (PCB) for testing, and tests are made using the complete module, which includes at least the SiP and the PCB board. However, such an approach is not suitable for EOL tests.

In view of the above, there is a need for a device, a system and a method which allow for improved EOL testing of the electromagnetic performance of integrated RF transceivers with integrated antennas (AiP).

SUMMARY

A test set-up for testing a system-in package with an integrated antenna is described herein. In accordance with one embodiment, the test set-up includes a carrier with an RF probe arranged thereon and a test socket with resilient electric contacts. The test socket is mounted on the carrier and provides an electric contact to interconnects of the package when placed on the test socket, wherein the test socket has an opening which is arranged superjacent to the RF probe.

Moreover, a system for testing a system-in package (SiP) with an integrated antenna is described herein. In accordance with one example, the system comprises a wafer chuck configured to receive the package, an automatic test equipment, including a carrier with an RF probe arranged thereon and further including a test socket with resilient electric contacts mounted on the carrier. The wafer chuck is configured to place the package on the test socket so that the resilient electric contacts of the test socket provide an electric contact to interconnects of the package, wherein the test socket has an opening which is arranged superjacent to the RF probe.

Furthermore, a method for testing a system-in package with an integrated antenna is described. In accordance with one embodiment, the method includes placing the package on a test socket using a wafer chuck, wherein the test socket is attached on a carrier and includes resilient electric contacts that provide an electric contact to interconnects of the package. The method further includes using an RF probe mounted on the carrier to obtain near-field measurements of an electromagnetic field emanating from the integrated antenna, wherein the electromagnetic field extends through an opening in the test socket. Far-field data is calculated based on the near-field measurements.

BRIEF DESCRIPTION OF THE DRAWINGS

The invention can be better understood with reference to the following drawings and descriptions. The components in the figures are not necessarily to scale; instead emphasis is placed upon illustrating the principles of the invention. More-over, in the figures, like reference numerals designate corresponding parts. In the drawings.

DETAILED DESCRIPTION

Embodiments of the present invention are discussed below in the context of a radar transceiver. It should be noted, however, that the present invention may also be applied in applications different from radar such as, for example, RF transceivers of RF communication devices. In fact, the herein described approach for testing the electromagnetic performance of a system-in-package with integrated antenna does not depend on the specific application of the system.

Figure 1:
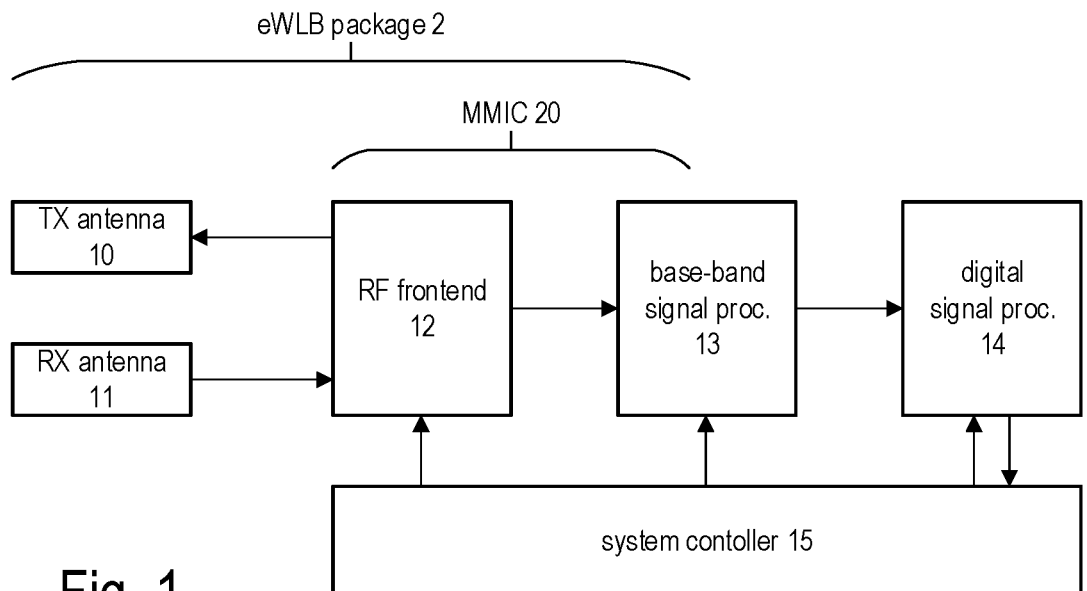
FIG. 1 is a block diagram illustrating one exemplary structure of a radar sensor.

FIG. 1 illustrates a block diagram that illustrates an exemplary structure of a radar sensor. However, a similar structure may also be found in RF transceivers used in other applications such as communications systems. Accordingly, at least one transmit antenna 10 (TX antenna) and at least one receive antenna 11 (RX antenna) are connected to an RF frontend 12, which includes all the circuit components needed for RF signal processing. Such circuit components include, for example, RF power amplifiers, low noise amplifiers (LNAs), directional couplers such as rat-race-couplers and circulators, and mixers for the down-conversion of RF signals into the base-band or an intermediate frequency (IF) band or the up-conversion of base-band signals or IF signals into the RF band. It is noted that antenna-arrays may be used instead of single antennas. The depicted example is a bistatic (or pseudo-monostatic) radar system, which has separate RX and TX antennas. In case of a monostatic radar system, a single antenna or a single antenna array may be used for both, receiving and transmitting electromagnetic (radar) signals.

In case of a frequency-modulated continuous-wave (FMCW) radar system, the transmitted RF signals radiated by the TX antenna 10 are in the range above approximately 20 GHz (e.g. 24 GHz and 77 GHz in automotive applications) and composed of so-called "chirps" (frequency ramps). The RF signals received by the RX antenna 11 includes the radar echoes, i.e. the signals back-scattered at the so-called radar targets. As mentioned, the received RF signals are down-converted into the base band and further processed in the base-band using analog signal processing (see FIG. 1, base-band signal processing chain 13), which basically includes filtering and amplification of the base-band signal. The base-band signal is finally digitized using an analog-to-digital converter and further processed in the digital domain (see FIG. 1, digital signal processing chain 14), e.g. using a digital signal processor. The overalls system is controlled by a system controller 15, which may be at least partly implemented using a processor such as a microcontroller executing appropriate firmware.

Figure 2:
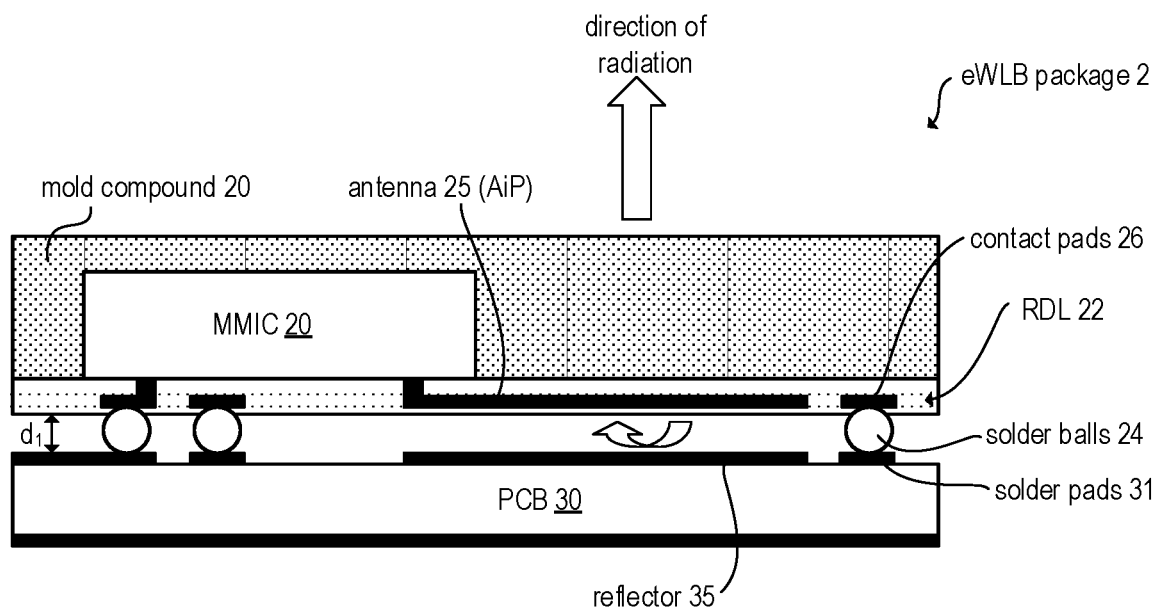
FIG. 2 schematically illustrates one example of a system in package (SiP) that includes a MMIC and an integrated antenna and is attached to a printed circuit board.

In modern radar transceivers the RF frontend is integrated in a so-called monolithic microwave integrated circuit 21 (MMIC), which may (optionally) also include the analog base-band signal processing chain (e.g. amplifiers, filters, etc.) or parts thereof. In the examples described herein, the MMIC 21 and the antennas 10, 11 are integrated in a single package such as an Extended Wafer Level Ball Grid Array (eWLB) package 2. eWLB is a known packaging technology for integrated circuits. As shown in FIG. 2, the package interconnects are formed by solder balls 24 attached to respective contact pads 26 formed in a so-called redistribution layer 22 (RDL), which may be a copper layer and which is applied on an artificial wafer composed of silicon chips (e.g. MMIC 21) and a mold compound 20. One or more antennas 25 are also integrated in the redistribution layer 22, for example in the form of patch antennas (c.f. antennas 10, 11 of the system shown in FIG. 1). Thus, a highly compact system-in-package (SiP) with integrated antennas-om-package (AiP) is formed. An array of small solder balls 24 (i.e. a ball grid array) may be attached onto the surface of the redistribution layer 22, wherein each solder ball 24 is attached to a corresponding contact pad 26 formed in the redistribution layer 22. The solder balls 24 provide electric interconnects for the system-in-package allow for an electric connection between the solder pads 26 of the RDL 22 and corresponding solder pads on a printed circuit board (PCB). It is noted that, although patch antennas are used in the herein-described examples, other types of antennas could also be used, for example circular antennas, folded dipole antennas, fractal antennas, etc.

In the application (e.g. a radar sensor module) or for the purpose of testing, the eWLB package 2 including the MMIC 21 and the patch antenna 25 is attached (by a soldering process) onto a printed circuit board 30 (PCB) as shown in FIG. 2, wherein each ball 24 of the eWLB package 2 is soldered to a corresponding solder pad 31 formed in a top metallization layer of PCB 30. The metallization layer also includes a reflector 35, which is basically a metal pad having a similar size like the one or more antennas 25 and which is arranged substantially parallel to the antenna(s) 25, when the package 2 is attached to the PCB 30. eWLB packages and processes for manufacturing eWLB packages are as such known in the field of semiconductor manufacturing and thus not further discussed here. It is noted that, although eWLB packages are shown in the herein-described examples, the present disclosure is not limited to such chip packages and the concepts described herein may also be applied with other types of chip packages.

The reflector 35 has a significant impact on the radiation characteristic (radiation pattern) of the antenna (25). As many types of antennas radiate substantially equally into two opposing directions (e.g. the two main lobes of a substantially planar antenna point in two opposing directions away from the plane, in which the planar antenna is arranged), a reflector is used to redirect the electromagnetic radiation that is radiated off the antenna in the "wrong" (undesired) direction. In the example of FIG. 2, the reflector 35 reflects the electromagnetic radiation that is initially radiated towards the PCB 30 into a direction away from the PCB 30. In essence, the reflector 35 may be regarded as a part of an antenna arrangement (composed of patch antenna 25 and reflector 35) which has a directional characteristic. Thereby, distance $d_1$ (see FIG. 2) between antenna 25 and reflector 35 affects the radiation characteristic of the antenna arrangement.

When looking at the structure illustrated in FIG. 2, one will see that testing the MMIC 21 and the integrated antenna(s) 25 in an EOL test is not possible without further measures because the reflector 35 will not be present unless the chip package 2 is soldered to the PCB 30. However, an automatic EOL testing would be desirable to obtain some important parameters of the system such as the effective isotropically radiated power (EIRP), transmitted RF power, effective antenna gain, system gain (i.e. the gain of the analog RF frontend circuit arranged in the MMIC, e.g. the sum of the gains of antenna, LNA, mixer, and base-band filters and amplifiers), etc.

Figure 3:
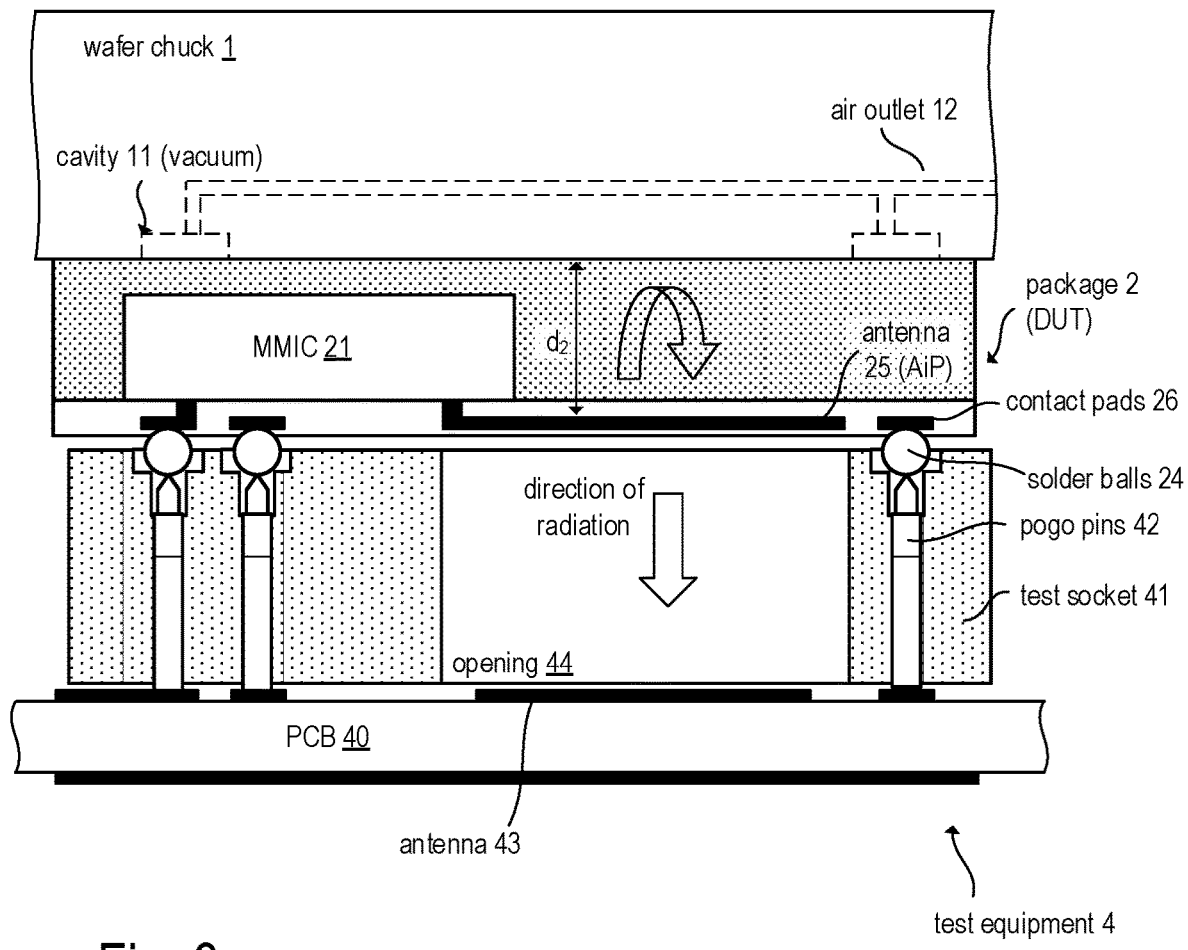
FIG. 3 schematically illustrates a test set-up for testing a system-in-package (SiP) held by a wafer chuck in an EOL test.

FIG. 3 schematically illustrates a test set-up, which allows for testing a systems-in-package (SiPs) with integrated antennas such as the eWLB package of FIG. 2 in an EOL test, while the packages are still attached to a Blue Tape and held by a wafer chuck 1 (e.g. a vacuum chuck). "Blue Tape" is a common name for an adhesive tape, which is used as a carrier for a wafer before the individual dies or eWLB packages are singularized. The Blue Tape is not shown in FIG. 3. However, it would be arranged between the wafer chuck 1 and the eWLB package 2. The wafer chuck 1 holds the chip packages 2 using suction. That is, a vacuum is generated in a shallow cavity 11 in the surface of the chuck 1 covered by the chip package. The exhaust air drained via air out-let 12 of the chuck. Purpose, usage, and function of wafer chucks are well-known in the field of semiconductor manufacturing and thus not further discussed here.

According to the example illustrated in FIG. 3, the chip package 2 (device under test, DUT) is not firmly bonded to a PCB (as it would be the case when using a solder process) but rather placed on a test socket 41, that includes a plurality of pogo-pins 42 to contact the solder balls 24 of the chip package 2. The test socket 41 is attached to a carrier, which is a test board (PCB 40) in the present example. Test sockets including pogo-pins are and their use for chip testing is as such known and thus not further discussed herein in more detail. However, different from conventional test sockets the test socket 41 includes an opening 44 forming a through-hole directly opposing the antenna(s) 25, which are integrated in the eWLB package 2, when placed on the test socket 41. During the test operation of the MMIC 21, the through-hole (opening 44) allows the radiation to propagate towards the test socket 41 in order to pass through the test socket 41 and reach one or more further antennas 43 that are formed in a top metallization layer of the subjacent carrier (test PCB 40). The metallic surface of the wafer chuck 1 acts as a reflector, which reflects radiation, which propagates towards the wafer chuck 1, so that it is redirected towards the carrier (test PCB 40).

The integrated antenna 25 (AiP) and the metallic surface of the wafer chuck 1 form an antenna arrangement similar to the arrangement of FIG. 2, where the integrated antenna 25 is paired with reflector 35 on PCB 30. However, while in the example of FIG. 2 the reflector 35 is arranged underneath the integrated antenna 25 (close to the bot-tom surface of the chip package, on which the solder balls 24 are arranged), the wafer chuck 1, which forms the reflector in the example of FIG. 3, adjoins the top surface of the chip package 2 and is thus arranged above the integrated antenna 25. Thus, the reflector 35 in the example of FIG. 3 and the wafer chuck 1 in the test set-up shown in FIG. 3 are arranged on opposing sides of the chip-package 2. Furthermore, the reflector 35 of FIG. 3 and the wafer chuck 1 of FIG. 3 may be arranged at different distances from the integrated antenna 25.

The PCB 40 and the components arranged thereon may be regarded as part of an automatic test equipment 4 (ATE). The antenna 43 arranged on the test PCB 40 is connected to test circuitry that is configured to receive electromagnetic signals radiated from the integrated antenna 25 and to transmit electromagnetic test signals to be received by the integrated antenna 25. More than one antenna may be arranged on the PCB and connected to the test circuitry and, as mentioned, the chip package 2 may include more than one integrated antenna. The test circuitry may be at least partly arranged on the test PCB 40. In some embodiments, however, the test PCB 40 includes only interfaces to an external test device, which may generate signals to be radiated by the antenna(s) 43 or which evaluates the signals received by the antenna(s) 43.

Figure 4:
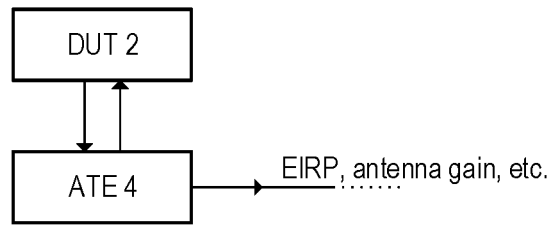
FIG. 4 illustrates a block diagram of the test set-up of FIG. 3 connected to an automatic test equipment (ATE).

FIG. 4 illustrates a block diagram of the test set-up shown in FIG. 3. The device under test (DUT), i.e. the eWLB package 2 in the example of FIG. 3, is coupled to a test socket 41 via pogo-pins 42 and via the electromagnetic coupling of the integrated antenna(s) 25 and the antenna(s) 43 arranged on the PCB 40, which can be regarded as part of an automatic test equipment 4 (ATE). The test socket 41 carrying the pogo pins 42 is also mounted on PCB 40. It should emphasized, however, that other kinds of detachable contacts different from pogo pins may also be used in alternative embodiments. Examples for suitable alternatives include any kind of resilient electric contacts, like membranes (e.g. with photolithographically defined strip-lines formed thereon), spring contacts, needle contacts, contact pads including conductive elastorere, etc. The use of these examples for temporarily contacting semiconductor chip packages, dies and wafers for testing purposes (similar as it is done using pogo-pins) is as such known and thus not further explained here. For example, so-called "probe cards" including a membrane for contacting a semiconductor chip (e.g. an eWLB package) are commercially available, e.g. from Cascade Microtech Inc. In this example, the probe-card may be regarded as carrier 40 and the membrane as part of the test socket.

The signal processing of the signals received by the ATE 4 via the pogo pins 42 or via the antenna(s) 43 is as such known and therefore only shortly summarized herein. First, it should be mentioned that the antenna 43 can be regarded as a probe for measurements in the near-field of the integrated antenna 25 (also called "near field probe"). For a frequency of 77 GHz, the corresponding wavelength is approximately 4.3 mm and the distance between DUT 2 and PCB 40 is also in the range of a few millimeters and thus within the near-field of the integrated antenna 25. Various types of near-field probes are known and the antenna 43 may also be replaced by other types of near-field probes. In this regard, it is referred to the following publications: S. Dieter, W. Menzel, "*High-Resolution Probes for Near-Field Measurements of Reflectarray Antennas*", IEEE Antennas and Wireless Propagation Letters, vol. 8, pp. 157-160, 2009; S. Dieter, Z. Yang, W. Menzel, "*A 77 GHz Near-Field Probe with Integrated Illuminating Waveguide*", Proc. of the 6th German Microwave Conference, pp. 1-4, 2011; and Z. Tsai et al., "*A V-Band On-Wafer Near-Field Antenna Measurement System Using an IC Probe Station*", IEEE Trans. on Antennas and Propagation, vol. 61, no. 4, pp. 2058-2067, 2013. These publications are herewith incorporated in their entirety by reference.

To obtain the desired measurement results such as the EIRP form near-field measurements of the integrated antenna 25, the measured data can be processed to compute the corresponding far-field pattern of the antenna. One possible method for "converting" near-field measurements to obtain the far-field pattern is presented in the publication M. Farouq, M. Serhir, D. Picard, "*Antenna Characterization From Arbitrary Near Field Measurement Geometry*", Proc. of the 2014 IEEE Conf. on Antenna Measurements & Applications (CAMA), pp. 1-4, 2014, which is herewith incorporated in its entirety by reference. The distance $d_2$ (see FIG. 3) between the integrated antenna 25 and the surface of the chuck 1, which acts as a reflector, can be considered in the mathematical model used for these calculations.

Figure 5:
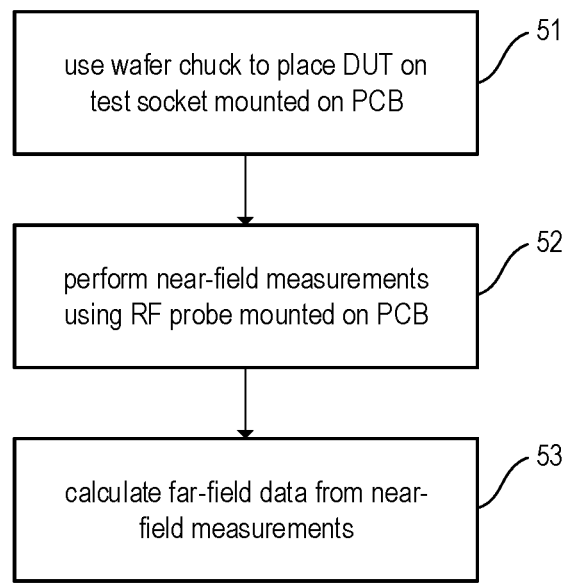
FIG. 5 illustrates a flow chart of a test procedure accomplished using the ATE of FIG. 4.

FIG. 5 illustrates one exemplary method for automatically testing a DUT with an AiP. Accordingly, a wafer chuck (see FIG. 3) is used to place the DUT (e.g. an eWLB package with integrated antenna) on a test socket mounted on a PCB, which is part of an ATE (block 51). Subsequently, the ATE communicates with the DUT, e.g. via electrical contacts provided by the test socket and causes the DUT to generate an RF signal radiated by the integrated antenna(s). Near-field measurements are made (block 51) using an RF probe (e.g. antenna 43 shown in FIG. 3). As discussed above, data representing the far-field of the integrated antenna 25 may be calculated from the near-field measurements (block 53). Finally, the parameters of interest, which characterize the DUT, may be derived from the calculated far-field data. Such parameters of interest, may be EIRP, transmitted RF power, effective antenna gain, etc. To accomplish the mentioned calculations, the ATE may include a processor (e.g. a personal computer) executing appropriate software. In one example, the ATE may include a processing unit (e.g. a personal computer), which may be programmed to perform the mentioned calculations to obtain the sought far-field data and/or the desired parameter(s) of the DUT.

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A test set-up for testing a system-in package (SiP) with an integrated antenna, the test set-up comprises:
a carrier with an RF probe antenna arranged thereon; and
a test socket with resilient electric contacts, the test socket being mounted on the carrier and providing an electric contact to interconnects of the SiP when placed on the test socket,
wherein the test socket has an opening which is arranged superjacent to the RF probe antenna, the opening providing a passage through the test socket such that electromagnetic radiation emanating from the integrated antenna included in the SiP passes through the opening and reaches the RF probe antenna.

2. The test set-up of claim 1, further comprising:
a wafer chuck configured to receive the SiP.

3. The test set-up of claim 2,
wherein the wafer chuck is configured to place the SiP on the test socket such that the resilient electric contacts are electrically connected to the interconnects of the SiP.

4. The test-set-up of claim 1,
wherein the resilient electric contacts are formed by one of: resilient pins, spring contacts, pogo-pins, needle contacts, electrically conductive elastomer contacts, and electrical lines formed on a membrane.

5. The test-set-up of claim 1,
wherein the carrier is a printed circuit board or a probe-card.

6. A system for testing a system-in package (SiP) with an integrated antenna, the system comprises:
a wafer chuck configured to receive the SiP; and
an automatic test equipment including a carrier with an RF probe antenna arranged thereon and a test socket with resilient electric contacts mounted on the carrier;
wherein the wafer chuck is configured to place the SiP on the test socket so that the resilient electric contacts of the test socket provide an electric contact to interconnects of the SiP, and
wherein the test socket has an opening which is arranged superjacent to the RF probe antenna, the opening providing a passage through the test socket such that electromagnetic radiation emanating from the integrated antenna included in the SiP passes through the opening and reaches the RF probe antenna.

7. The system of claim 6,
wherein the automatic test equipment is configured to cause the SiP to generate an RF signal, which is radiated by the integrated antenna.

8. The system of claim 7,
wherein the automatic test equipment is configured to receive a measured signal provided by the RF probe antenna.

9. The system of claim 7,
wherein the distance between the SiP and the RF probe antenna is such that, for a given RF band including the RF signal, the RF probe antenna is in the near-field of the integrated antenna of the SiP.

10. The system of claim 8,
wherein the automatic test equipment is configured to calculate, based on the measured signal provided by the RF probe antenna, data representing a far-field pattern of the integrated antenna.

11. The system of claim 10,
wherein the automatic test equipment is configured to derive at least one parameter of the SiP or the integrated antenna from the calculated far-field data.

12. A method for testing a system-in package (SiP) with an integrated antenna, the method comprises:
placing the SiP on a test socket using a wafer chuck, the test socket being attached on a carrier and including resilient electric contacts that provide an electric contact to interconnects of the SiP;
using an RF probe antenna mounted on the carrier to obtain near-field measurements of an electromagnetic field emanating from the integrated antenna, the electromagnetic field extending through an opening in the test socket that is arranged superjacent to the RF probe antenna; and
calculating far-field data from the near-field measurements.

13. The method of claim 12 further comprising:
controlling, via the resilient electric contacts of the test socket, the SiP to generate an RF signal, which is supplied to the integrated antenna and causes the electromagnetic field.

14. The method of claim 12 further comprising:
calculating, based on the calculated far-field data, one or more parameters of the SiP or the integrated antenna or both.

15. The method of claim 14,
wherein the one or more parameters include at least one of the following: EIRP, transmitted RF power, effective antenna gain, and system gain.

16. The test set-up of claim 1, wherein the RF probe antenna is formed in a layer of the carrier.

17. The test set-up of claim 1, wherein the opening in the test socket is a through hole positioned directly opposing the integrated antenna included in the SiP.

18. The test set-up of claim 1, wherein the RF probe antenna is arranged on the carrier parallel to the integrated antenna included in the SiP while the SiP is being tested.

19. The test set-up of claim 2, wherein the wafer chuck is configured to reflect the electromagnetic radiation emanating from the integrated antenna included in the SiP through the opening in the test socket to reach the RF probe antenna while the SiP is being tested.

* * * * *